(12) United States Patent
Burden

(10) Patent No.: US 7,119,400 B2
(45) Date of Patent: *Oct. 10, 2006

(54) ISOTOPICALLY PURE SILICON-ON-INSULATOR WAFERS AND METHOD OF MAKING SAME

(75) Inventor: Stephen J. Burden, Golden, CO (US)

(73) Assignee: Isonics Corporation, Golden, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/746,427

(22) Filed: Dec. 24, 2003

(65) Prior Publication Data

US 2004/0169225 A1 Sep. 2, 2004

Related U.S. Application Data

(63) Continuation-in-part of application No. 10/189,732, filed on Jul. 3, 2002, now Pat. No. 6,867,459.

(60) Provisional application No. 60/303,455, filed on Jul. 5, 2001.

(51) Int. Cl.
*H01L 27/01* (2006.01)
(52) U.S. Cl. .................. 257/347; 257/76; 257/E27.112
(58) Field of Classification Search .................. 257/76, 257/347, E27.112
See application file for complete search history.

(56) References Cited

U.S. PATENT DOCUMENTS

| 4,722,763 A | 2/1988 | Pa et al. ........................ 117/81 |
|---|---|---|
| 5,144,409 A | 9/1992 | Ma .............................. 357/61 |
| 5,442,191 A | 8/1995 | Ma .................................. 257/1 |
| 5,891,242 A | 4/1999 | Pesklak et al. |
| 5,917,195 A | 6/1999 | Brown .......................... 257/22 |
| 6,084,895 A | 7/2000 | Kouchi et al. ................. 372/36 |
| 6,146,601 A | 11/2000 | Abesadze et al. .............. 423/89 |
| 6,344,375 B1 | 2/2002 | Orita et al. ................... 438/151 |
| 6,365,098 B1 | 4/2002 | Fulbright ..................... 420/578 |
| 6,392,220 B1 | 5/2002 | Slater et al. ................. 250/216 |
| 6,653,658 B1 | 11/2003 | Burden ......................... 257/76 |
| 6,661,065 B1 | 12/2003 | Kunikiyo ..................... 257/411 |
| 2003/0013275 A1 | 1/2003 | Burden |
| 2003/0034243 A1 | 2/2003 | Yokoyama et al. |
| 2003/0039865 A1 | 2/2003 | Kelsey et al. |
| 2003/0183159 A1 | 10/2003 | Nakagawa et al. |
| 2003/0194945 A1 | 10/2003 | Drown et al. |

FOREIGN PATENT DOCUMENTS

| GB | 2379994 A * | 3/2003 |
|---|---|---|
| JP | 20002000069557 | 12/2000 |
| JP | 20002000007224 | 7/2001 |

OTHER PUBLICATIONS

Wolf et al., Silicon Processing for the VLSI Era, vol. 1: Process Technology, Lattice Press, Sunset Beach, California, pp. 151-155.

* cited by examiner

*Primary Examiner*—Allan R. Wilson

(57) ABSTRACT

A semiconductor wafer structure having a device layer, an insulating layer, and a substrate which is capable of supporting increased semiconductor device densities or increased semiconductor device power. One or more of the layers includes an isotopically enriched semiconductor material having a higher thermal conductivity than semiconductor material having naturally occurring isotopic ratios. The wafer structure may be formed by various techniques, such as wafer bonding, and deposition techniques.

19 Claims, 4 Drawing Sheets

EMBODIMENT OF PRESENT INVENTION

EMBODIMENT OF PRESENT INVENTION

EMBODIMENT OF PRESENT INVENTION

EMBODIMENT OF PRESENT INVENTION

DEVICE WAFER BEFORE BONDING

HANDLE WAFER BEFORE BONDING

WAFER STRUCTURE AFTER BONDING

FINAL WAFER STRUCTURE

ISOTOPICALLY PURE SILICON-ON-INSULATOR WAFERS AND METHOD OF MAKING SAME

CROSS-REFERENCE TO RELATED APPLICATIONS

This application is a continuation-in-part of U.S. patent application Ser. No. 10/189,732 filed Jul. 3, 2002 now U.S. Pat. No. 6,867,459, which claims the benefit of U.S. Provisional Application Ser. No. 60/303,455 filed Jul. 5, 2001. These related applications are incorporated herein in their entirety by this reference.

FIELD OF THE INVENTION

The present invention relates to methods of making improved semiconductor wafer structures having isotopically-enriched layers.

BACKGROUND OF THE INVENTION

Silicon on insulator (SOI) wafers are becoming an increasingly accepted form of silicon wafer for the manufacture of semiconductor devices. SOI wafers have a thin layer of silicon dioxide below the surface of the single crystal silicon wafer. This layer electrically isolates the surface layer from the bulk of the wafer and allows semiconductor devices to operate at higher speeds with lower power consumption. Thus, the wafer structure consists of a top single crystal silicon layer (the device layer), an amorphous silicon dioxide layer (the buried oxide or BOX layer), and a substrate or handle wafer. The handle wafer is typically a single crystal silicon wafer. A typical wafer structure is shown in FIG. 1 in which layer 1 is the device layer wherein the semiconductor device is fabricated; layer 2 is the BOX or insulator layer; and layer 3 is the substrate.

Power dissipation in a semiconductor device is limited by the thermal conductivity of the materials from which it is made. This thermal conductivity in turn limits the packing density of the transistors on a semiconductor wafer or the amount of power that can be generated in a circuit without inducing circuit failure. Thus, one side effect of electrically isolating the top silicon layer with silicon dioxide is that the top layer is also thermally insulated from the silicon substrate. This accentuates the self-heating of circuits and can cause problems with high power devices such as microprocessors. Several designs have been proposed to overcome the detrimental effects of this thermal isolation including the use of local thermal paths to transport the heat through the oxide layer or the fabrication of a "partial" SOI wafer having areas of wafer without an oxide layer.

These designs are difficult and therefore expensive to implement. A novel solution provided by embodiments of the present invention is the use of high thermal conductivity silicon-28 in the manufacture of SOI wafers. By utilizing an isotopically-enriched silicon-28 device layer and/or an isotopically-enriched silicon-28 layer under the oxide, lateral heat spreading can be enhanced. This is particularly true for thin-film SOI wafers where the top silicon layer is much less than one micron thick. With these wafers, the device layer can be natural silicon since the thermal transport in the device layer is primarily controlled by interface scattering effects and not by the bulk properties of the silicon. In this case an underlayer of isotopically-enriched silicon helps greatly to spread the heat generated in the device layer. Silicon-28 can be incorporated without changing the device design and at relatively modest cost since the amount of silicon-28 in these thin layers is small. Fabricating isotopically modified SOI wafers allows for increased power densities in these devices, thereby enhancing the performance of many electronic devices now on the market.

SUMMARY OF THE INVENTION

Accordingly, the present invention provides improved semiconductor wafer structures having isotopically-enriched layers and methods of making such wafers. In one embodiment, the invention discloses a SOI wafer structure wherein at least one of the layers includes an isotopically enriched material.

In one embodiment, the top device layer is an isotopically-enriched semiconductor material of isotopically-enriched silicon, isotopically-enriched germanium, isotopically-enriched silicon-germanium alloys and combinations and alloys thereof. The electrically-insulating layer may be formed by thermal oxidation or nitridation of the substrate silicon wafer in a suitable atmosphere or formed by a deposition technique such as chemical vapor deposition. The resulting wafer structure includes a top layer which is an isotopically enriched semiconductor material.

In another embodiment of the present invention, the wafer structure comprises an upper device layer having an isotopically-enriched semiconductor layer, an insulating layer of silicon dioxide or silicon nitride, which has been formed on an isotopically enriched silicon substrate, or alternatvely, an isotopically-enriched silicon layer which has been deposited on top of a natural silicon substrate. The resulting wafer structure has an isotopically enriched semiconductor layer, an isotopically enriched electrically insulating layer, an isotopically enriched silicon layer, and a natural silicon substrate.

In another embodiment of the present invention, the wafer structure is comprises a semiconductor device layer composed of the naturally occurring isotope ratios, an electrically insulating layer of silicon dioxide or silicon nitride, which has been formed or deposited on an isotopically enriched silicon substrate, or alternatively, an isotopically enriched silicon layer which has been formed on top of a natural silicon substrate. The resulting wafer structure includes a semiconductor device layer with natural isotope ratios, the electrically insulating layer, the isotopically enriched silicon layer, and a natural silicon substrate.

The electrically insulating silicon dioxide or silicon nitride layer can include naturally occurring isotope ratios or isotopically enriched in either silicon or oxygen isotopes.

DETAILED DESCRIPTION OF THE INVENTION

Figure 1:
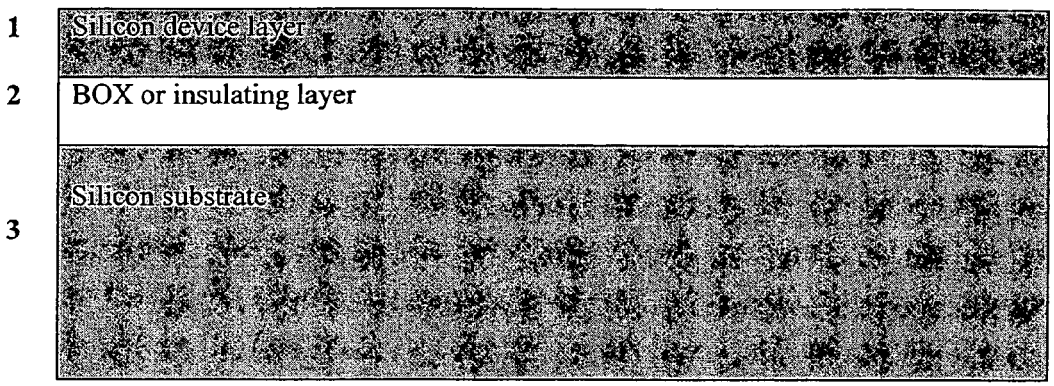
FIG. 1 is a schematic of the typical prior art wafer structure in which layer 1 is the top silicon layer or device layer, layer 2 is the BOX or insulating layer and layer 3 is the natural silicon substrate. All the layers are composed of the normal isotopic ratios for the elements involved.

In the naturally occurring form, silicon is composed of three stable isotopes; approximately 92.2% $^{28}$Si, 4.7% $^{29}$Si and 3.1% $^{30}$Si, which is roughly the composition of crystals and wafers used by the semiconductor industry. The presence of multiple isotopes contributes to phonon scattering which decreases the thermal conductivity of naturally occurring silicon.

Isotopically-enriched $^{28}$Si has been shown to have a thermal conductivity 60% to 600% higher than naturally occurring silicon as described in Capinski et al., *Thermal Conductivity of Isotopically-enriched Si*, Applied Physics Letters, v71, pp. 2109–11 (1997), and Ruf et al., *Thermal Conductivity of Isotopically-enriched Silicon*, Solid State Communications, v115, pp. 243–47 (2000), both of which are incorporated herein in their entirety by this reference. Isotopically-enriched means the silicon has a higher proportion of one of the isotopes of silicon than is present in naturally occurring silicon (e.g., it is composed of at least 98% $^{28}$Si).

Isotopically pure germanium has also demonstrated improved thermal conductivity over naturally occurring germanium crystals as described in Ozhogin et al, *Isotope Effects in the Thermal Conductivity of Germanium Single Crystals*, JETP Letters, Vol. 63, No. 6, pp490–494, (1996), and in Asen-Palmer et al, *Thermal Conductivity of Germanium Crystals with different Isotopic Compositions*, Physical Review B, Vol. 56, No. 15, pp 9431–9447, (1997) incorporated herein in its entirety by this reference. In the case of germanium, isotopically-enriched means the enriched germanium has a higher proportion of one of the isotopes of Ge than is present in naturally occurring germanium (e.g., it is composed of at least 80% $^{74}$Ge).

Higher thermal conductivity means devices fabricated from the high thermal conductivity wafer exhibit lower peak temperatures, faster device speeds and higher frequency performance than previous, conventional wafers. Lower temperatures will result in higher carrier mobility and reduced leakage currents which result in lower heat generation within the material. In addition, higher thermal conductivity means that it is possible to increase device packing densities within integrated circuit chip designs and to increase power output per unit area of power devices. Furthermore, the invention has applicability in device structures such as semiconductor laser arrays, micro-electromechanical devices(MEMS), micro-opto-electromechanical devices (MOEMS), optical switches, light emitting diodes, and laser diodes which utilize silicon substrates or silicon layers primarily for heat dissipation. The use of the present invention in such cases improves the thermal performance of the devices.

Any electronic device which relies on silicon, germanium, or Si—Ge alloys can be enhanced by the use of components made from the enriched isotopes to the extent that they impart improved thermal conductivity. Examples of such devices include integrated circuits, lasers, and diodes as described in U.S. Pat. No. 5,144,409 which is incorporated herein in its entirety by this reference.

Figure 2:
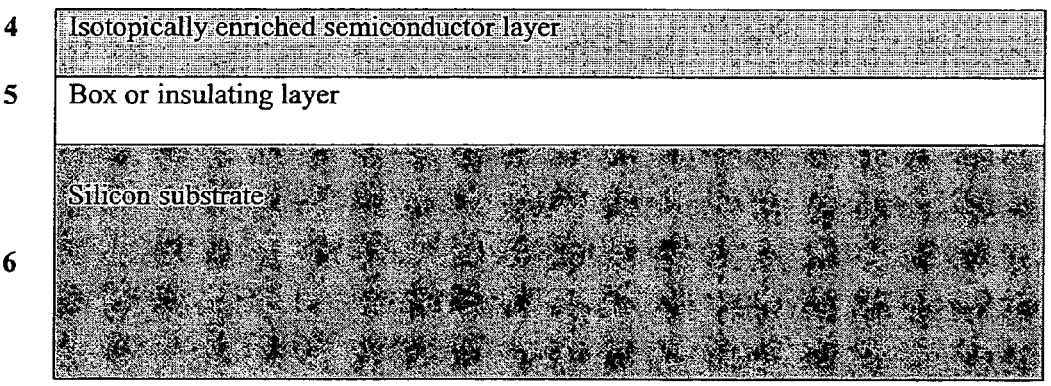
FIG. 2 is a schematic of one wafer structure of the present invention in which Layer 4 is a top isotopically enriched semiconductor layer or device layer, layer 5 is an isotopically enriched buried oxide or insulating layer; and layer 6 is a natural silicon substrate.

Referring now to FIG. 2, a schematic of a wafer structure of an embodiment of the present invention is illustrated. In this embodiment, a top isotopically enriched semiconductor layer or device layer 4 is located on an isotopically enriched buried oxide or insulating layer 5. A silicon substrate 6 is located at the bottom layer, and in this embodiment is silicon having naturally occurring isotopic ratios.

Figure 3:
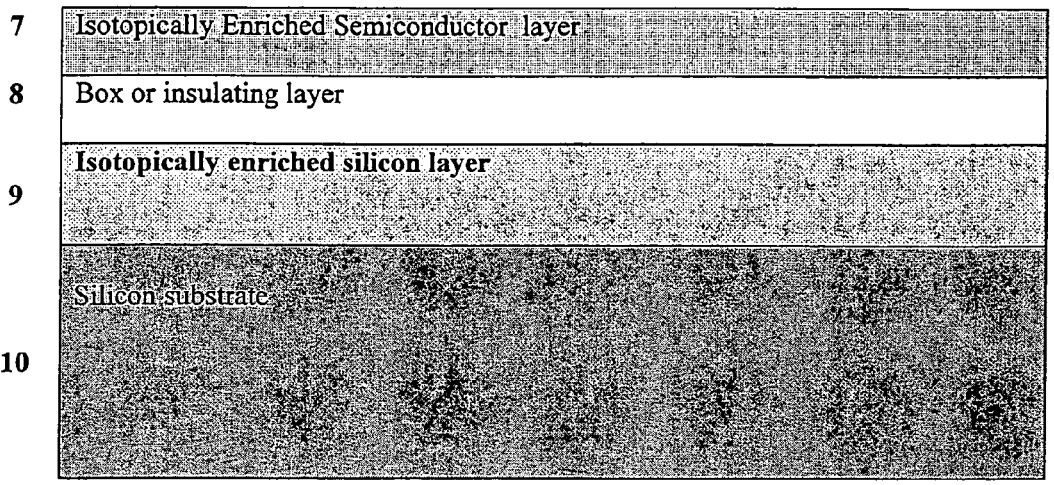
FIG. 3 is a schematic of another wafer structure of the present invention in which Layer 7 is the top isotopically enriched device layer, layer 8 is the buried oxide or insulator layer; layer 9 is an isotopically-enriched silicon layer and layer 10 is the substrate.

FIG. 3 is an illustration of a wafer structure of another embodiment of the present invention. In this embodiment, a top isotopically enriched device layer 7 is located on a buried oxide or insulator layer 8. A second isotopically-enriched semiconductor layer 9 is beneath the buried oxide 8, and layer 10 is the silicon substrate.

Figure 4:
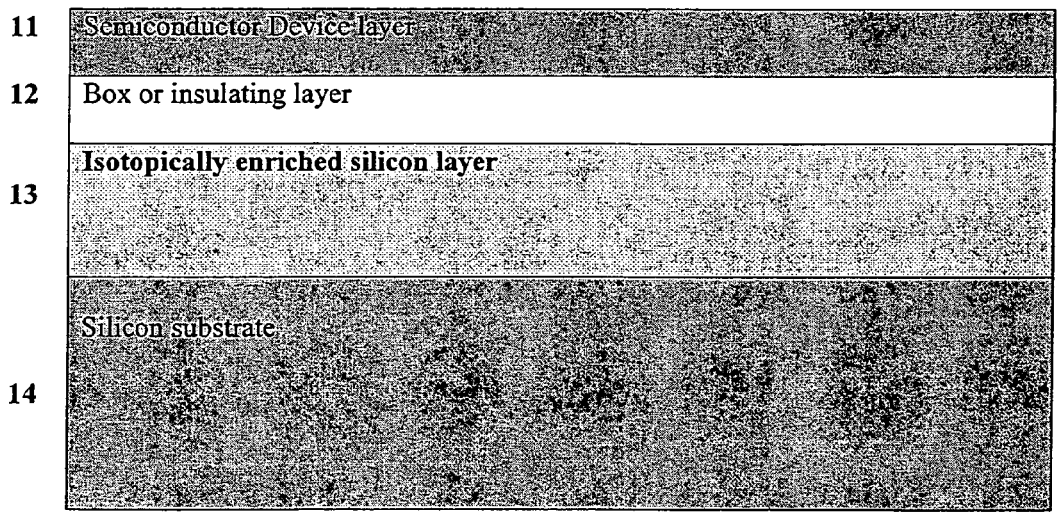
FIG. 4 is a schematic of another wafer structure of the present invention in which Layer 11 is the top semiconductor device layer having natural isotopic ratios, layer 12 is the buried oxide or insulator layer; layer 13 is an isotopically-enriched silicon layer and layer 14 is the substrate.

FIG. 4 is an illustration of another embodiment of the present invention. In this embodiment, semiconductor device layer 11 is the top layer having natural isotopic ratios, which is used in the fabrication of semiconductor devices. A buried oxide (BOX) or insulator layer 12 is beneath the semiconductor device layer 11. An isotopically-enriched silicon layer 13 is beneath the BOX or insulator layer 12, and a substrate 14 is present below the isotopically-enriched silicon layer. In this embodiment, techniques used in traditional (non-isotopically enriched) semiconductor fabrication may be employed for the semiconductor device layer. Thus, a wafer having the wafer structure of FIG. 4 may be substituted for a traditional wafer, without having to alter manufacturing processes in a fabrication facility, to produce semiconductor devices which have enhanced cooling properties.

Figure 5:
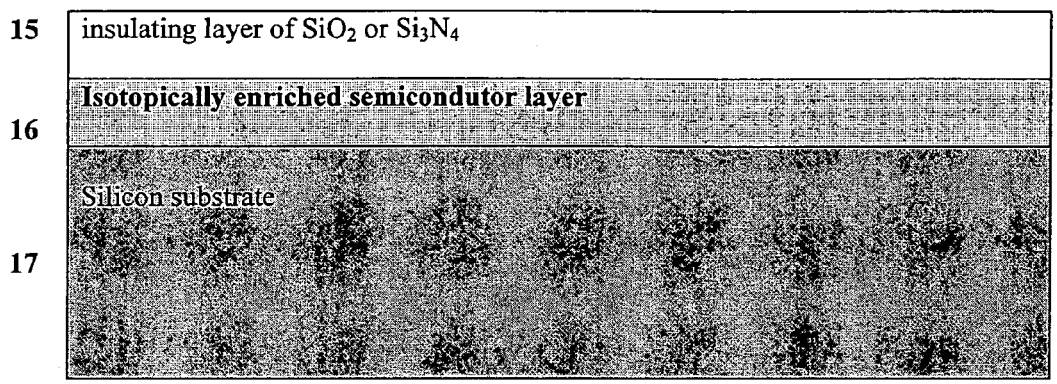
FIGS. 5 and 6 depict one manufacturing method of the present invention. The top faces of the wafer structures shown in FIG. 5 and FIG. 6 are bonded together to form a bonded wafer structure.
Figure 6:
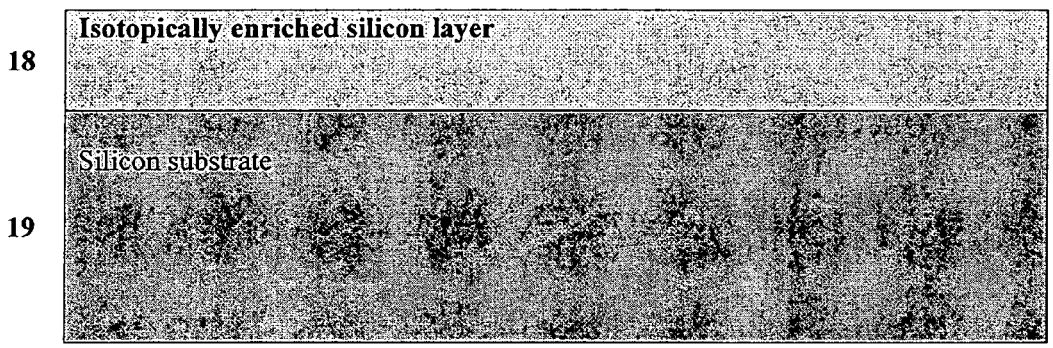

One embodiment of the present invention is a wafer structure formed by bonding two wafers together, illustrated in FIGS. 5–8. Each wafer is composed of a substrate, usually silicon, germanium or a silicon-germanium alloy, and may have a top layer of an isotopically enriched semiconductor material. One or both of the wafers has an electrically insulating layer composed of silicon dioxide or silicon nitride on the top surface. This electrically insulating layer can be formed by typical methods known in the art, such as heating the wafer in an atmosphere of oxygen or nitrogen, or depositing the silicon oxide or silicon nitride by any of several depositon methods practiced by semiconductor wafer manufacturers. For convenience, one of the two wafers is termed the handle wafer and the other wafer is termed the device wafer, based on its intended use in the final structure. FIG. 5 shows the structure of one possible device wafer and FIG. 6 shows the structure of one possible handle wafer before bonding.

Figure 7:
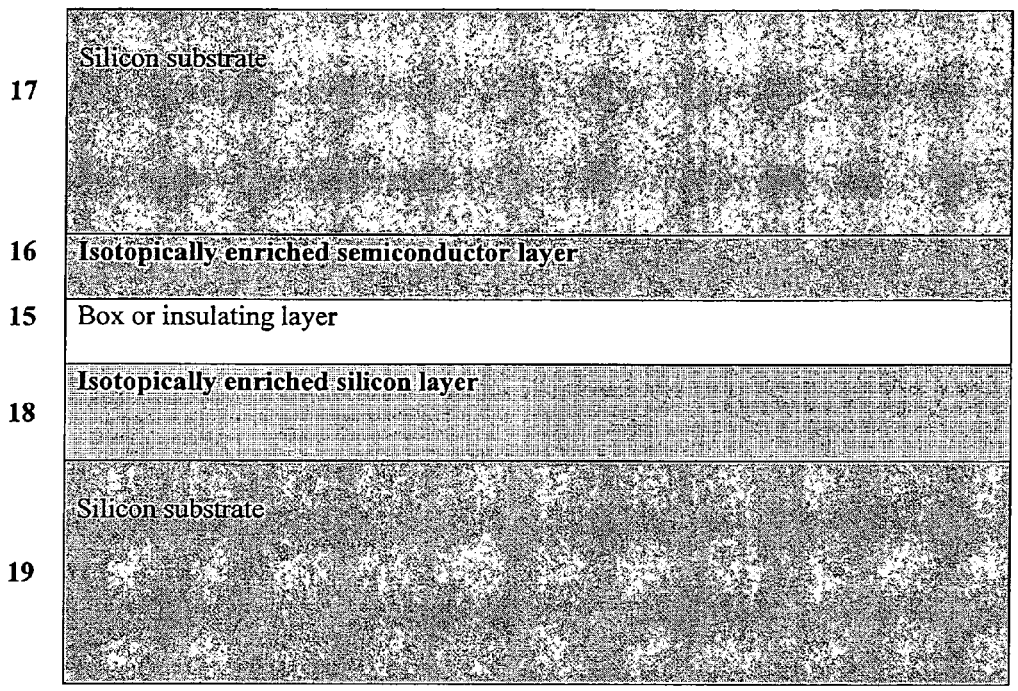
FIG. 7 illustrates the bonded wafer structure following the manufacturing steps illustrated in FIGS. 5 and 6.
Figure 8:
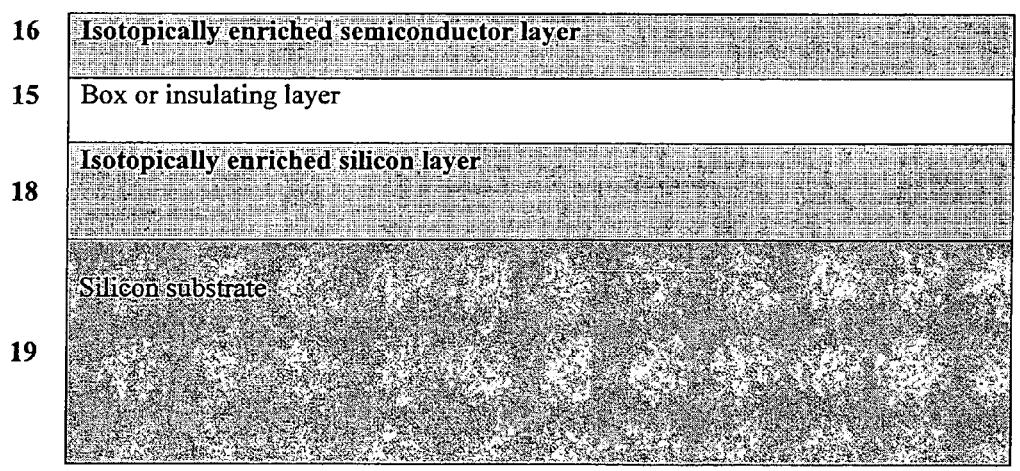
FIG. 8 illustrates a final wafer structure of the manufacturing steps of FIGS. 5–7 and following the removal of the substrate wafer from FIG. 5.

The isotopically-enriched semiconductor layer can be composed of isotopically-enriched silicon, isotopically-enriched germanium, isotopically-enriched silicon-germanium alloys or combinations thereof. The isotopically-enriched layer serves to provide increased heat dissipation. The isotopically enriched layer can be formed by vapor phase epitaxial deposition or other technique used in the manufacture of epitaxial wafers. The top surface of both wafers are then bonded together to form a sandwich as shown in FIG. 7. The bonding can be accomplished by one of several methods known by those skilled in the art of SOI wafer manufacturing. After annealing at an elevated temperature to strengthen the bond between the wafers, the device wafer substrate is removed by grinding, polishing, etching or other means, leaving the top isotopically enriched semiconductor layer bonded to the insulating layer of the handle wafer as shown in FIG. 8. The remaining device layer thickness can be from 1 nanometer to 100 microns thick, depending on the final use of the wafer.

Bonding can be accomplished by starting with substrate wafers that have been polished on at least one surface to a surface roughness of less than 10 angstroms and a total thickness variation of less than 1 micron. The surfaces to be bonded should be clean and free from foreign material. When these conditions are met and the surfaces of the handle and device wafers are put into intimate contact, Van de Waals forces will hold the wafers together with sufficient force so that the wafer pair can be handled. The wafer pair is then heated to an elevated temperature, typically from 400 to 1100° C., to strengthen the bond sufficiently for handling and removal of the device wafer substrate.

In a preferred embodiment of the present invention, the isotopically enriched semiconductor layer is composed of at least 95%, more preferable at least 98%, and most preferably 99% of the silicon-28 isotope. The surface is then thermally oxidized to produce an isotopically enriched silicon dioxide layer which becomes the BOX (buried oxide) layer after bonding to a second wafer.

In another preferred embodiment of the present invention the isotopically enriched semiconductor layer is composed of at least 80% of one of the germanium isotopes. In this case, the insulating layer of silicon dioxide or silicon nitride will be formed on the silicon handle wafer before bonding.

Another fabrication method for the wafer structure of the present invention uses layer transfer technology, as described in U.S. Pat. Nos. 5,374,564, 6,391,740, 6,372,609, or 6,352,909, to bond a thin layer of a semiconductor material to a second wafer. Prior to bonding, the device wafer is subjected to ion bombardment or implantation of a suitable species such as hydrogen atoms or ions. This ion bombardment cause a damaged, weakened area to be formed in the device layer at a predetermined depth. By subjecting the bonded wafer structure to a thermal anneal, the weakened area enables the remaining device wafer to be easily be removed by one of several means practiced in the art. This process is one way to remove the unwanted device wafer substrate and has benefit for the manufacture of device layers in the range of 1 to 1,000 nanometers thick.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best modes presently known of practicing the inventions and to enable others skilled in the art to utilize the inventions in such, or in other embodiments, and with the various modifications required by their particular application or uses of the invention. It is intended that the appended claims be construed to include alternative embodiments to the extent permitted by the prior art.

What is claimed is:

1. A multi-layer semiconductor wafer structure comprising:
   a substrate;
   an insulating layer on said substrate; and
   a top device layer of semiconducting material on said insulating layer, wherein said top device layer comprises multiple layers of semiconductor material selected from the group consisting of silicon enriched to at least 95% of the silicon-28 isotope, germanium enriched to at least 80% of one of the germanium isotopes, silicon-germanium alloys enriched to at least 95% of the silicon-28 isotope, and combinations and alloys thereof,
   and wherein the structure is formed by bonding two wafers together.

2. The wafer structure of claim 1, wherein the semiconductor material layer is silicon enriched to at least 99% of the silicon-28 isotope, and the substrate is single crystalline silicon composed of natural isotopic ratios.

3. The wafer structure of claim 1, wherein the insulating layer includes at least one of silicon dioxide and silicon nitride.

4. The wafer structure of claim 1, wherein the structure is formed by layer transfer techniques.

5. The wafer structure of claim 1, wherein the substrate is silicon composed of a single crystalline orientation.

6. The wafer structure of claim 1, wherein the substrate is silicon composed of a multiple crystal orientations.

7. A multi-layer semiconductor wafer structure comprising:
   a single crystal silicon substrate;
   a first layer of silicon on the single crystal silicon substrate;
   a second layer, which is electrically insulating on the first layer; and
   a top device layer on the second layer, said top device layer comprising a semiconductor material selected from the group consisting of silicon enriched to at least 95% of the silicon-28 isotope, germanium enriched to at least 80% of one of the germanium isotopes, silicon-germanium alloys enriched to at least 95% of the silicon-28 isotope, and combinations and alloys thereof.

8. The wafer structure of claim 7, wherein the top device layer comprises multiple layers of semiconductor material selected from the group consisting of silicon enriched to at least 95% of the silicon-28 isotope, germanium enriched to at least 80% of one of the germanium isotopes, silicon-germanium alloys enriched to at least 95% of the silicon-28 isotope, and combinations and alloys thereof.

9. The wafer structure of claim 7, wherein the structure is formed by bonding two wafers together.

10. The wafer structure of claim 7, wherein the structure is formed by layer transfer techniques.

11. The wafer structure of claim 7, wherein the single crystal silicon substrate is composed of silicon having natural isotopic ratios.

12. The wafer structure of claim 7, wherein the single crystal silicon substrate is composed of silicon having natural isotopic ratios and the top device layer is composed of at least 98% of the silicon-28 isotope.

13. The wafer structure of claim 7, wherein the single crystal silicon substrate is composed of silicon having natural isotopic ratios and the top device layer is composed of at least 99% of the silicon-28 isotope.

14. The wafer structure of claim 7, wherein the single crystal silicon substrate is composed of silicon having natural isotopic ratios, the first layer is composed of at least 99% of the silicon-28 isotope, the second layer is formed by thermal oxidation of the silicon-28 layer, and the top device layer is one or more layers of silicon enriched to at least 95% of the silicon-28 isotope, germanium enriched to at least 80% of one of the germanium isotopes, or silicon-germanium alloys enriched to at least 95% of the silicon-28 isotope.

15. The wafer structure of claim 7, wherein the top device layer is formed by a method selected from the group consisting of chemical vapor deposition, molecular beam epitaxy, vapor phase epitaxy, liquid phase epitaxy, atomic layer deposition or physical vapor deposition.

16. A multi-layer semiconductor wafer structure comprising:
- a substrate;
- an insulating layer on said substrate; and
- a top device layer of semiconducting material on said insulating layer,
- wherein the semiconductor material layer comprises a semiconductor material selected from the group consisting of germanium enriched to at least 80% of one of the germanium isotopes, silicon-germanium alloys enriched to at least 95% of the silicon-28 isotope, and combinations and alloys thereof.

17. A multi-layer semiconductor wafer structure comprising:
- a silicon substrate composed of silicon having multiple crystal orientations;
- an insulating layer on said substrate; and
- a top device layer of semiconducting material on said insulating layer,
- wherein at least one of the substrate and insulating layer is comprised of isotopically enriched elements of silicon, germanium, or silicon-germanium alloys.

18. The multi-layer semiconductor wafer structure of claim 17, wherein the structure is formed by bonding two wafers together.

19. A multi-layer semiconductor wafer structure comprising:
- a single crystal silicon substrate composed of silicon having natural isotopic ratios;
- a first layer on the single crystal silicon substrate composed of at least 99% of the silicon-28 isotope;
- a second layer on the first layer, said second layer being electrically insulating and formed by thermal oxidation of the first silicon-28 isotope layer; and
- a top device layer comprising at least one layer of silicon, germanium, or silicon-germanium alloys, all having natural isotopic ratios.

* * * * *